(12) United States Patent
Tavakkoli Kermani Ghariehali

(10) Patent No.: US 12,130,549 B2
(45) Date of Patent: Oct. 29, 2024

(54) METHOD OF MANUFACTURING A TEMPLATE

(71) Applicant: CANON KABUSHIKI KAISHA, Tokyo (JP)

(72) Inventor: Amir Tavakkoli Kermani Ghariehali, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 503 days.

(21) Appl. No.: 17/449,029

(22) Filed: Sep. 27, 2021

(65) Prior Publication Data

US 2023/0095286 A1 Mar. 30, 2023

(51) Int. Cl.
*G03F 1/38* (2012.01)
*B05D 1/26* (2006.01)
*B05D 3/06* (2006.01)
*G03F 1/80* (2012.01)
*G03F 7/00* (2006.01)

(52) U.S. Cl.
CPC .............. *G03F 1/38* (2013.01); *B05D 1/265* (2013.01); *B05D 3/067* (2013.01); *G03F 1/80* (2013.01); *G03F 7/0002* (2013.01)

(58) Field of Classification Search
None
See application file for complete search history.

(56) References Cited

U.S. PATENT DOCUMENTS

| 10,935,883 | B2 | 3/2021 | Tavakkoli Kermani Ghariehali et al. |
| 2006/0266916 | A1 | 11/2006 | Miller et al. |
| 2007/0054097 | A1 | 3/2007 | Suehira et al. |
| 2008/0303187 | A1 | 12/2008 | Stacey et al. |
| 2016/0247673 | A1 | 8/2016 | Tsuji et al. |
| 2017/0040161 | A1 | 2/2017 | Sato |
| 2019/0086798 | A1 | 3/2019 | Nagai et al. |
| 2019/0101822 | A1* | 4/2019 | Tavakkoli Kermani Ghariehali ............ G03F 7/0002 |

FOREIGN PATENT DOCUMENTS

| JP | 2018014483 A | 1/2018 |
| WO | 2019198668 A1 | 10/2019 |

* cited by examiner

*Primary Examiner* — Michael P. Rodriguez
(74) *Attorney, Agent, or Firm* — Abel Schillinger, LLP

(57) ABSTRACT

A method of manufacturing a template including a mesa on a second side is disclosed. The method can include depositing a first coating on the second side, depositing a photocurable material over a top of the mesa, contacting the photocurable material with a second surface to cause the photocurable material to cover the top surface of the mesa and at least a portion of a side of the mesa, curing the photocurable material to form a cured film on the top surface and to form a cured extrusion on at least a portion of the side surface, the cured extrusion is thicker than the cured film, etching the top surface of the mesa to remove the first coating and the cured film from the top surface, and removing the cured extrusion to form the template with the first coating on the side surface.

20 Claims, 7 Drawing Sheets

500

```
┌─────────────────────────────────────────────────────┐
│ PROVIDING A TEMPLATE, WHEREIN THE TEMPLATE COMPRISES│── 510
│                      A MESA                        │
└─────────────────────────────────────────────────────┘
                         │
                         ▼
┌─────────────────────────────────────────────────────┐
│    DEPOSITING A LIGHT-BLOCKING LAYER ON THE TEMPLATE│── 520
└─────────────────────────────────────────────────────┘
                         │
                         ▼
┌─────────────────────────────────────────────────────┐
│      DEPOSITING A PHOTOCURABLE MATERIAL ON THE      │── 522
│           PATTERNING SIDE OF THE TEMPLATE           │
└─────────────────────────────────────────────────────┘
                         │
                         ▼
┌─────────────────────────────────────────────────────┐
│            PATTERN THE PHOTOCURABLE MATERIAL        │── 524
└─────────────────────────────────────────────────────┘
                         │
                         ▼
┌─────────────────────────────────────────────────────┐
│       DEPOSITING A PHOTOCURABLE MATERIAL ON THE MESA│── 530
└─────────────────────────────────────────────────────┘
                         │
                         ▼
┌─────────────────────────────────────────────────────┐
│  CONTACTING PHOTOCURABLE MATERIAL ON THE MESA TO    │── 532
│      FORM EXTRUSIONS ON MESA SIDEWALLS              │
└─────────────────────────────────────────────────────┘
                         │
                         ▼
┌─────────────────────────────────────────────────────┐
│   CURING THE PHOTOCURABLE MATERIAL TO FORM A        │── 540
│   PHOTORESIST LAYER ON A TOP AND A SIDE OF THE MESA │
└─────────────────────────────────────────────────────┘
```

FIG. 5

METHOD OF MANUFACTURING A TEMPLATE

FIELD OF THE DISCLOSURE

The present disclosure relates to a method of manufacturing a nanoimprint lithography template.

RELATED ART

Nanoimprint lithography technique is useful in fabricating electronic devices on semiconductor wafers with templates and for fabricating replica templates to be used in nanoimprint lithography. Such technique may include the use of fluid dispense systems for depositing a formable material onto the wafer or a blank replica template. A template patterns the dispensed material before the dispensed material is solidified on the wafer or the blank replica template.

A nanoimprint technique may involve dispensing a variable drop pattern of polymerizable material on a substrate, where the drop pattern varies depending on the substrate topography and/or the template topography. A template is then brought into contact with the polymerizable material after which the material is polymerized on the substrate, and the template removed. For example, the process for creating a semiconductor device may include repeatedly adding and removing material to and from a substrate. This process can produce a layered substrate with an irregular height variation (i.e., topography), and as more layers are added, the substrate height variation can increase. The template is used repeatedly over a plurality of imprint fields and substrates. However, as the nanoimprint lithography process is repeated over several cycles, buildup can occur on mesa sidewalls of the template itself leading to defects in subsequent processing.

As such, improvements in nanoimprint technique are desired to allow for buildup of material on the mesa sidewalls.

SUMMARY

In an aspect a method of manufacturing a template is disclosed. The method of manufacturing the template can include (a) providing the template, where the template can include a body and a mesa, where the template can include a first side and a second side, and where the mesa is on the second side of the body; (b) depositing a first coating on the second side of the template; depositing a photocurable material over a top surface of the mesa; (c) contacting the photocurable material over the top surface of the mesa with a second surface to cause the photocurable material to cover the top surface of the mesa and to form a thick liquid extrusion on at least a portion of a side surface of the mesa; (d) curing the photocurable material to form a cured thin film on the top surface of the mesa and to form a thick cured extrusion on at least the portion of the side surface of the mesa, where the thick cured extrusion is thicker than the cured thin film; (f) etching the top surface of the mesa to remove the first coating and the cured thin film from the top surface of the mesa; and (g) removing the thick cured extrusion from the at least the portion of the side surface of the mesa to form the template with the first coating on the side surface of the mesa.

In another aspect, the method of manufacturing the template can further include depositing a second photoresist layer over the first coating prior to the deposition of the photocurable material over the top surface of the template and removing the second photoresist layer from the top surface of the mesa.

In yet another aspect, the method of manufacturing the template can further include removing the second photoresist layer from the template after removing the first coating from the top surface of the mesa.

In yet another aspect, the photocurable material can include a plurality of droplets and where at least one photocurable material droplet is deposited adjacent each edge of the mesa.

In yet another aspect, the first coating can include one or more of: chromium; molybdenum; tantalum; silicon; tungsten; titanium; aluminum; iron oxide; titanium; and a silver-halide emulsion.

In another aspect, curing the photocurable material to form the cured thin film on the top surface and the side surface of the mesa is done while the second surface is in contact with the photocurable material.

In yet another aspect, the method of manufacturing the template can further include separating the second surface from the cured thin film on the top surface and the side surface of the mesa.

In a further aspect, the mesa has a curvature on a base portion of the mesa.

In another aspect, the base portion of the mesa is between the top surface of the mesa and the second surface of the template.

In a further aspect, depositing the first coating on the second side of the template includes depositing the first coating on the top surface and sides of the mesa.

In yet another aspect, the second surface of the body is substantially parallel to the first surface of the body.

In a further aspect, the template can include a material selected from the group consisting of fused silica, quartz, sodium carbonate, calcium oxide, or any combination thereof.

In yet another aspect, the thick extrusion is deposited on all of the side surface of the mesa.

In yet another aspect, the first coating may be a light blocking layer.

In another aspect, the photocurable material may comprise a plurality of droplets and wherein at least one photocurable material droplet may be deposited at a distance that is less than 100 μm of the side surface of the mesa.

In another aspect, the first coating may include one or more of: a metal; a hydrophobic coating; a gas absorption coating; and a hardening coating.

In another aspect, steps (c) through (e) may be repeated multiple times prior to step (f) being performed.

In yet another aspect, the thick cured extrusion is on between 5% and 20% of the side surface of the mesa.

In a further aspect, spin-coating is used to deposit the photocurable material over the top surface of the mesa.

In another aspect, a method of manufacturing an article is disclosed. The method of manufacturing the article can include providing the template as described above, dispensing a formable material over a substrate; contacting the formable material over the substrate with a top surface of the mesa of the template; and curing the formable material contacting the top surface of the mesa to form a patterned layer over the substrate while the formable material contacting the side surface of the mesa remains in a liquid state; separating the template and the patterned layer on the substrate; processing the substrate on which the patterned layer has been formed; and manufacturing the article from the processed substrate.

BRIEF DESCRIPTION OF THE DRAWINGS

Embodiments are illustrated by way of example and are not limited in the accompanying figures.

FIG. 5 includes an illustration of a method manufacturing a template, according to one embodiment.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the arts.

Figure 1:
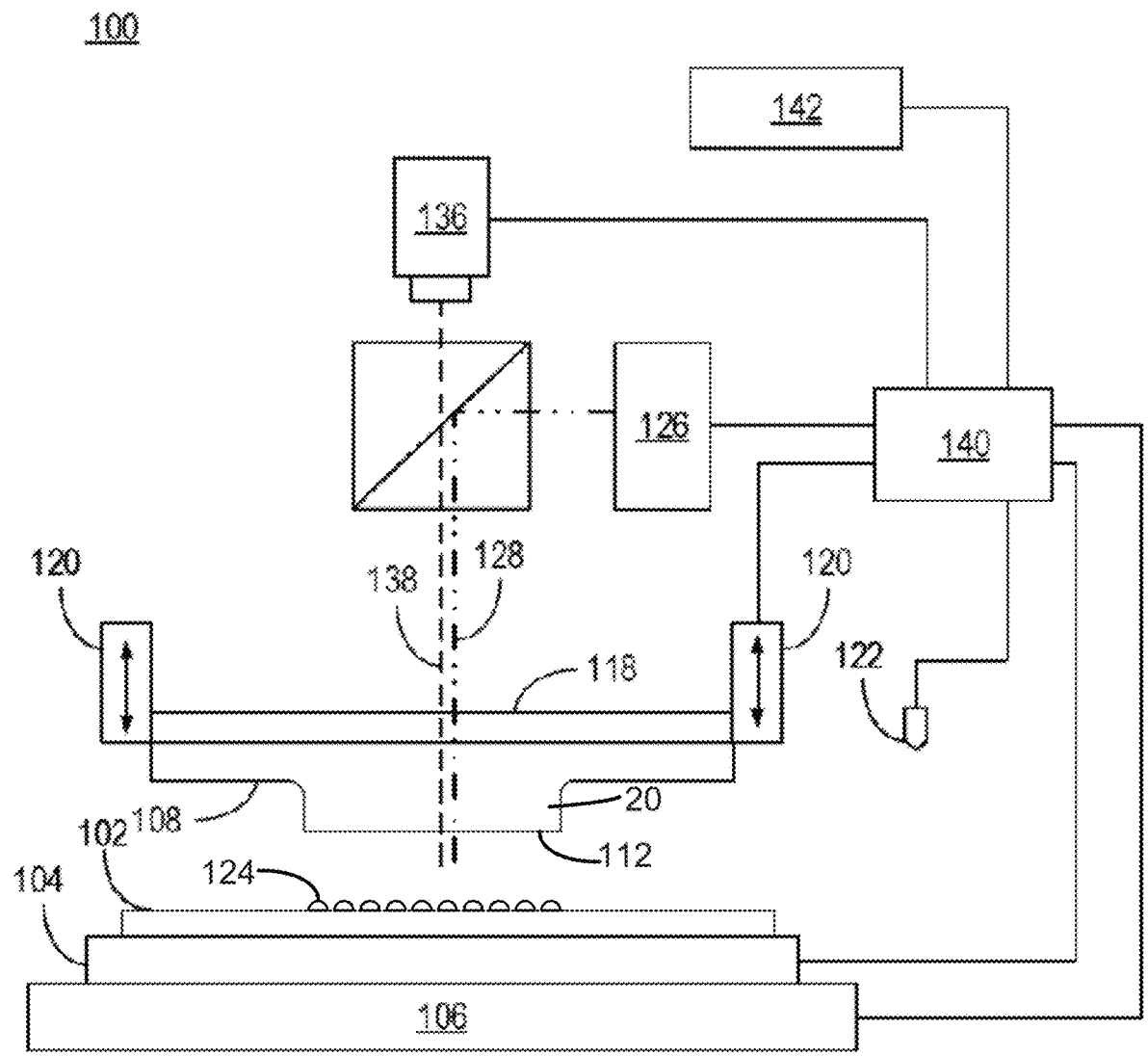
FIG. 1 includes an illustration of a side view of an exemplary system.

Referring to FIG. 1, an apparatus 100 in accordance with an embodiment described herein can be used to pattern a film on a substrate 102. The substrate 102 may be for example a semiconductor wafer or a blank nanoimprint lithography template. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like. Exemplary chucks are described in U.S. Pat. No. 6,873,087, which is hereby incorporated by reference.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

Spaced apart from the substrate 102 is a template 108, used for a relief pattern on the substrate 102, having a working surface 112 facing substrate 102. Template 108 may include a body having a first side and a second side with one side having a mesa 20 extending therefrom towards the substrate 102. In one embodiment, the mesa 20 may be referred to as a mold 20. In another embodiment, the template 108 may be formed without a mesa 20. Template 108 and/or mold 20 may be formed from materials including, but not limited to, fused silica, quartz, silicon, organic polymers, siloxane polymers, borosilicate glass, fluorocarbon polymers, metal, hardened sapphire, and/or the like. In an embodiment the template 108 is readily transparent to actinic radiation for example UV light. In one embodiment, the mesa 20 may have a patterned surface that may include features defined by a plurality of spaced-apart recesses and/or protrusions that form the basis of a pattern to be formed on the substrate 102. The mesa 20 can extend from the template 108 body at a thickness range of between 5 microns to 500 microns. The mesa can both define an area (imprint field) of the pattern that will be imprinted on a substrate and prevent the remainder of the template from making contact with any part of the substrate being imprinted during an imprint process. The mesa 20 helps to prevent any contact between the template 108 and the substrate 102 outside of where the formable material 124 has been dispensed, which runs the risk of causing a defect on the substrate 102 and/or damage to the template 108. The substrate 102 is divided into a plurality of imprint fields, each of which is imprinted with the template 108.

However, when such templates 108 are used, in particular under high throughput conditions, there can be a tendency to form extrusions, defined as the formable material which extends (or extrudes) beyond the border of the mesa surface. Such extruded material can accumulate on the mesa sidewalls and subsequently solidify upon exposure to actinic radiation. During separation of the template from the substrate following the curing of the formable material 124, the extruded, cured material can remain on the mesa sidewall of the template 108. The accumulated material can eventually break off and cause a defect on the substrate 102 and that negatively affects subsequent processing. Accordingly, the inventors have discovered a new design, described in detail below, to address extrusion defects.

Template 108 may be coupled to or retained by a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. In an embodiment the template chuck is likewise readily transparent to UV light. The template chuck 118 may include a system such as a zone based vacuum chuck, an actuator array, a pressure bladder, etc., which can apply a pressure differential to a back surface of the template 108 to cause the template 108 to bend and deform. In one embodiment, the template chuck 118 includes a zone based vacuum chuck which can apply a pressure differential to a back surface of the template, causing the template to bend and deform as further detailed herein.

The template chuck 118 may be coupled to a head 120 which is a part of the positioning system. The head 120 may be movably coupled to a bridge. The head 120 may include one or more actuators such as voice coil motors, piezoelectric motors, linear motor, nut and screw motor, etc., which are configured to move the template chuck 118 relative to the substrate 102 in at least the z-axis direction, and potentially other directions (e.g., x-, y-, θ-, ψ-, and φ-axis). Either the head 120, substrate positioning stage 106, or both can vary a distance between the mold 20 and the substrate 102 to define a desired volume there between that is filled by formable material 124.

The apparatus 100 may further comprise a fluid dispenser 122. The fluid dispenser 122 may also be movably coupled to the bridge. In an embodiment, the fluid dispenser 122 and the patterning head 120 share one or more of all positioning components. In an alternative embodiment, the fluid dispenser 122 and the patterned head move independently from each other. The fluid dispenser 122 may be used to deposit droplets of liquid formable material 124 (e.g., a photocurable polymerizable material) onto an imprint field of the substrate 102 with the volume of deposited material varying over the imprint field of the substrate 102 based on at least in part upon the topography profile of the substrate and the template. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing j ettable liquids. The dispenser 122 may dispense the formable material 124 onto a signal imprint field prior to the template 108 being brought into contact with the formable material 124, this process may then be repeated until the entire substrate is imprinted. In an alternative embodiment, the dispenser 122 may dispense the formable material 124 onto multiple imprint fields prior to the template 108 being brought into contact with the formable material 124, this process may then be repeated until the entire substrate is imprinted.

The apparatus 100 may further comprise a curing system that includes a radiation source 126 that directs actinic energy, for example, UV radiation, along an exposure path 128. The patterning head 120 and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124. This is done for illustrative purposes so that the relative position of the individual components can be easily identified. An individual skilled in the art would understand that exposure path 128 would not substantially change when the template 108 is brought into contact with the formable material 124.

The apparatus 100 may further comprise a camera 136 positioned to view the spread of formable material 124 as the template 108 contacts the formable material 124 during the patterned process. FIG. 1 illustrates an optical axis 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the template 108 and in contact with the formable material 124 and regions underneath the template 108 but not in contact with the formable material 124. The camera 136 may be configured to provide images of the spread of formable material 124 underneath the template 108, and/or the separation of the template 108 from cured formable material 124. The camera 136 may also be configured to measure interference fringes, which change as the formable material 124 spreads between the gap between the working surface 112 and the substrate surface.

The apparatus 100 may be regulated, controlled, and/or directed by one or more processors 140 (controller) in communication with one or more components and/or subsystems such as the substrate chuck 104, the substrate positioning stage 106, the template chuck 118, the head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an interne connected non-transitory computer readable storage device.

In operation, either the head 120, the substrate position stage 106, or both vary a distance between the template 108 and the substrate 102 to define a desired space (a bounded physical extent in three dimensions) that is filled with the formable material 124. For example, the patterning head 120 may be moved toward the substrate and apply a force to the template 108 such that the template 108 contacts and spreads droplets of the formable material 124 as further detailed herein.

Figure 2A:
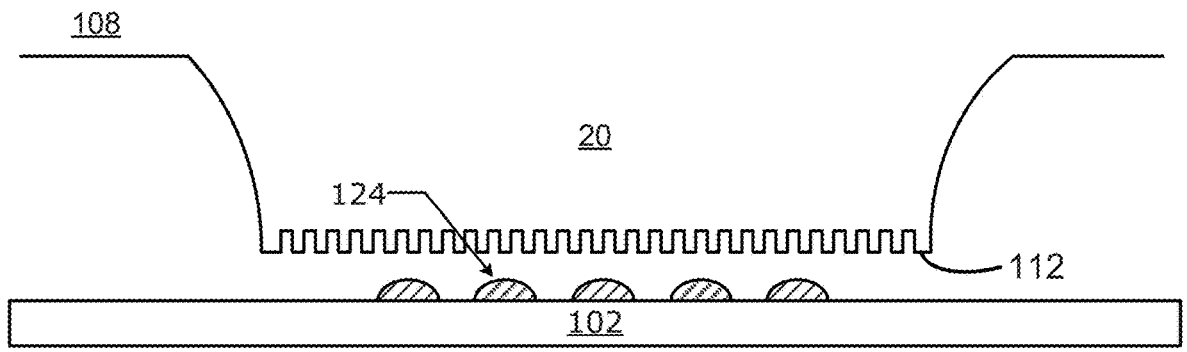
FIGS. 2A to 2E include an illustration of a patterned process.

FIGS. 2A-2E include illustrations of a performance of the template 108. As illustrated in FIG. 2A, the formable material 124 is dispensed in the form of droplets in an imprint field on the substrate 102. In one embodiment, the working surface 112 may not have any topography, in which case planarized layer is formed on the substrate 102. The template 108 is then positioned to be in contact with the formable material 124.

Figure 2B:
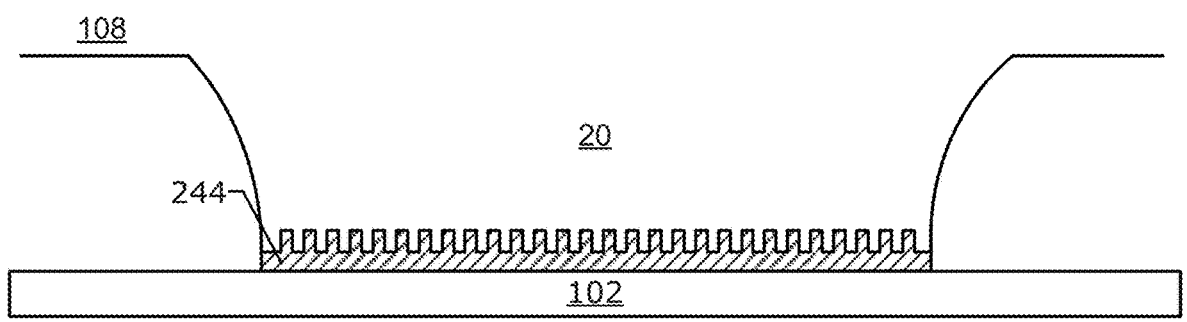
Figure 2C:
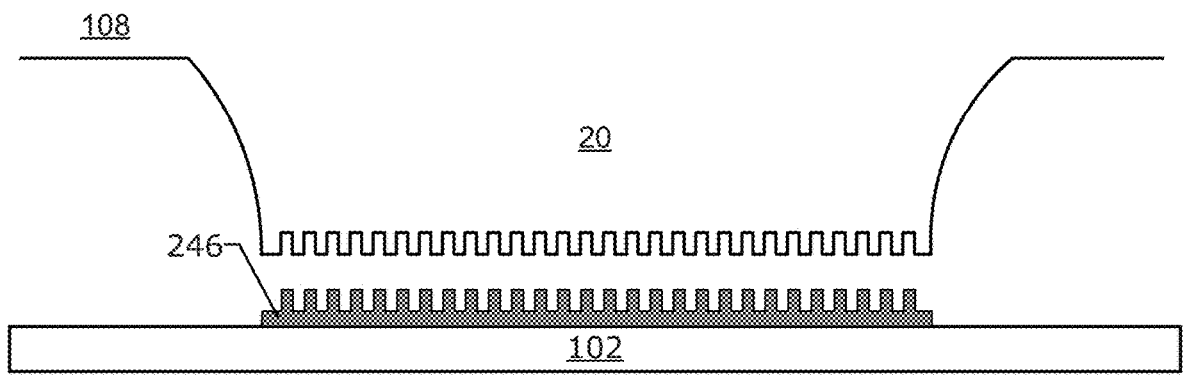

FIG. 2B illustrates a post-contact step after the template 108 has been brought into full contact with the formable material 124 but before a polymerization process starts. As the template 108 contacts the formable material 124, the droplets merge to form a formable material film 244 that fills the space between the template 108 and the substrate 102. Preferably, the filling process happens in a uniform manner without any air or gas bubbles being trapped between the template 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 244 to cure, solidify, and/or cross-link, defining a cured patterned layer 246 on the substrate 102. Alternatively, curing of the formable material film 244 can also be initiated by using heat, pressure, chemical reaction, other types of radiation, or any combination of these. Once cured, a planarized or patterned layer 246 is formed on the substrate 102, the template 108 can be separated therefrom as illustrated in FIG. 2C.

Figure 2D:
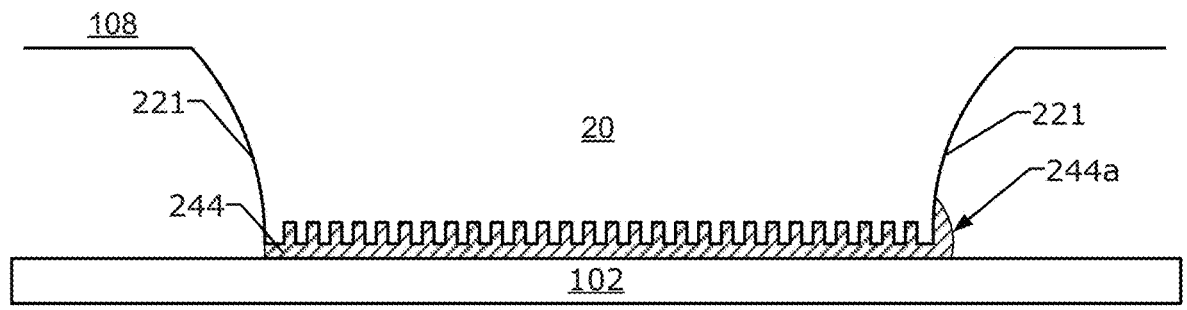
Figure 2E:
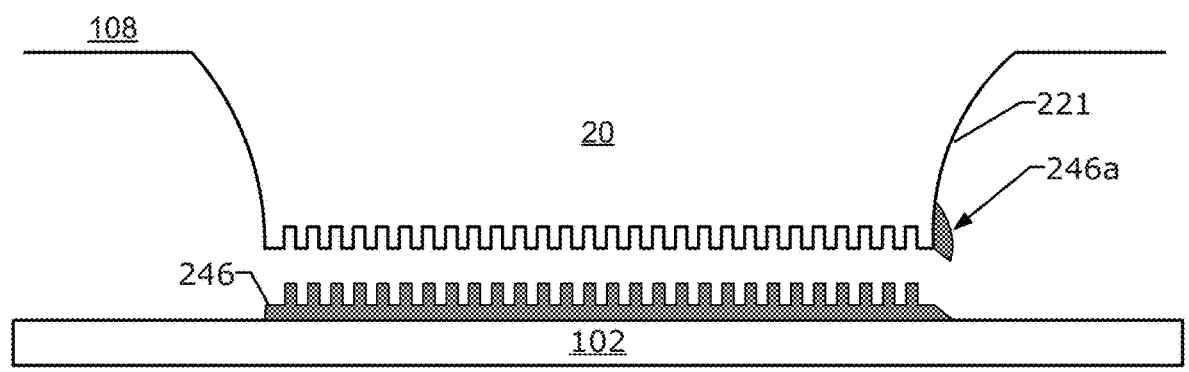

However, the filling process can cause some formable material 124 to extrude beyond the mesa sidewalls 221 (side surface of the mesa) of the mesa 20 forming a liquid extrusion 244a as illustrated in FIG. 2D. Traditionally, as polymerization or curing of the formable material film 244 is initiated, the liquid extrusions 244a adjacent to the mesa sidewalls 221 are also cured to form a cured extrusion 246a that can stick to the mesa sidewalls 221. Subsequently, as the template 108 separates from the substrate 102, the cured extrusions 246a adjacent to the mesa sidewalls 221 are stuck on the template 108 and can subsequently contaminate the next process. However, the template 308 is designed to include a coating 333 on the mesa sidewalls 221 to prevent such degradation by preventing the actinic radiation from reaching the liquid extrusions 244a adjacent to the mesa sidewalls 221 of the template 308. The coating 333 may include one or more of: a metal; a hydrophobic coating; a gas absorption coating; a conductive coating; and a hardening coating.

Figure 3A:
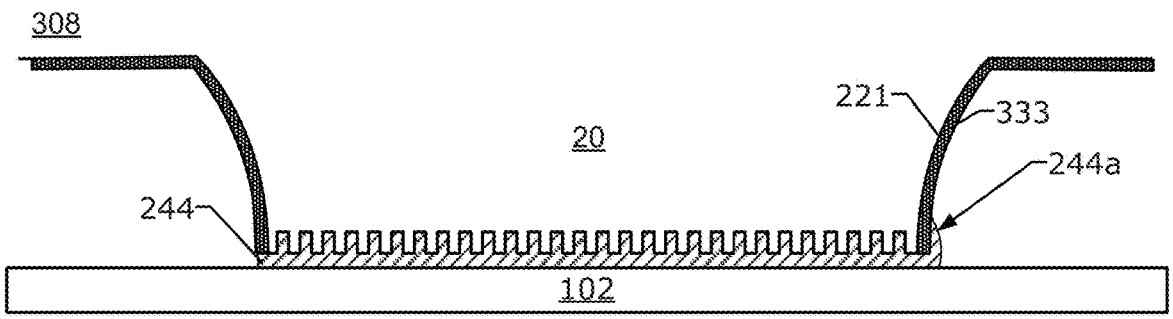
FIGS. 3A to 3D each include an illustration of a template, according to one embodiment.
Figure 3B:
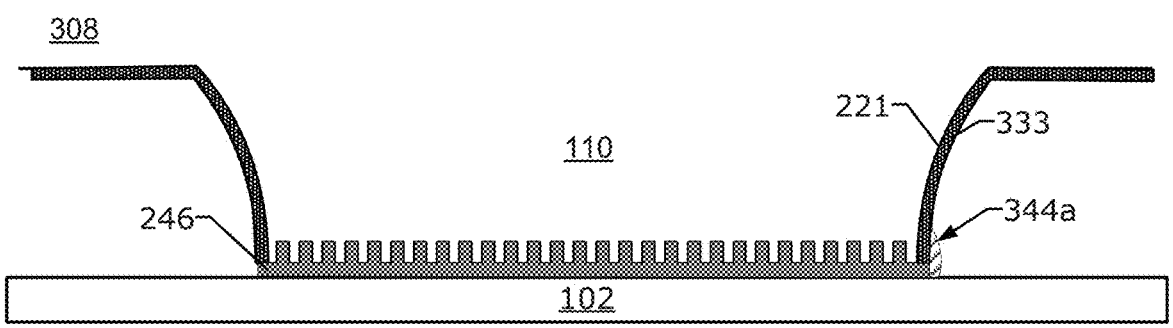
Figure 3C:
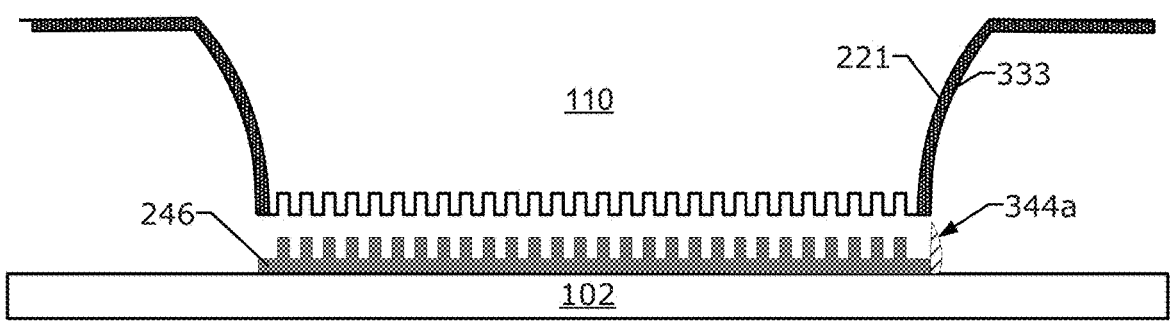

As seen in FIGS. 3A-D, advantageously, as the substrate 102 and template 308 separate, no formable material remains on the template 308. As illustrated in FIG. 3A the template 308 may cause a liquid extrusion 244a to form. During curing the coating 333 will block the actinic radiation from reaching the while the formable material film 244 is turned into the cured patterned layer 246. The coating 333 on the mesa sidewalls 221 may prevent curing of the liquid extrusion 244a around the mesa sidewalls 221. As such, any liquid extrusion 244a on the mesa sidewalls 221 will not be cured but instead can evaporate. As the template 308 separates from the substrate 102, as seen in FIG. 3C, the cured patterned layer 246 remains on the substrate 102 while the template 308 remains extrusion-free. A liquid extrusion 344a may remain on the substrate or template but will eventually evaporate. The substrate 102 and the cured patterned layer 246 may then be subjected to additional known steps and processes for device (article) fabrication, including, for example, planarization, further patterning, curing, oxidation, layer formation, deposition, doping, patterned, etching, formable material removal, dicing, bonding, and packaging, and the like. The substrate may be processed to produce a plurality of articles (devices).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

Figure 3D:
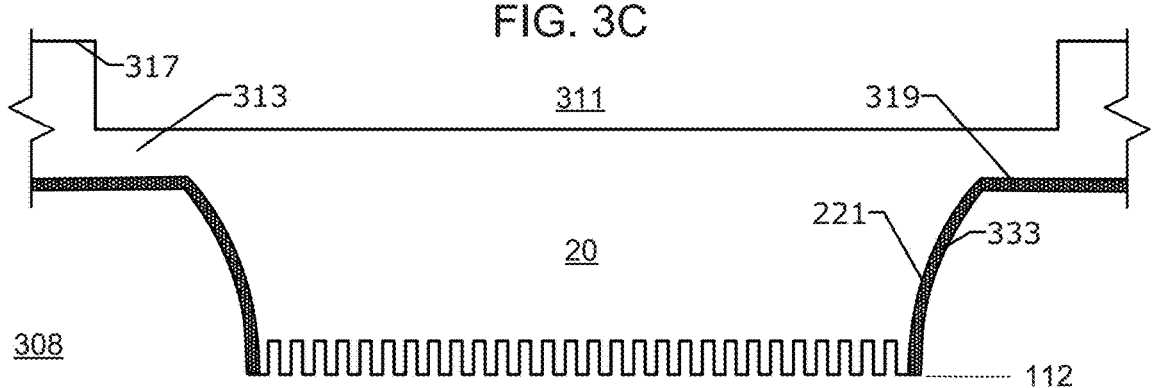

FIG. 3D includes an illustration of a template 308, according to one embodiment. The template 308 can be similar to the template 108 described above. The template 308 can include a core-out 311, a body 313, and a mesa 20. The mesa 20 can extend from a recessed surface 319 of the body 313. In one embodiment, the back surface 317 is opposite the recessed surface 319. In one embodiment, the back surface 317 can be a first side. The body 313 can be rectangular, square, polygonal, or any other geometric shape. In one embodiment, the mesa 20 can be of one cohesive piece with the body 313. In another embodiment, the mesa 20 can be a separate piece attached to the recessed surface 319 of the body 313. The mesa 20 can include a coating 333 on the mesa sidewalls 221 and the recessed surface 319 but not on the working surface 112, as seen in FIG. 3D. In another embodiment, the mesa 20 can include a coating on a portion or all of the mesa sidewalls 221.

The mesa 20 can include mesa sidewalls 221 extending from the recessed surface 319 of the body 313, and a working surface 112 connecting the mesa sidewalls 221. The mesa sidewalls 221 can each include a curvature adjacent to the recessed surface 319. In one embodiment, the mesa sidewalls 221 can include a curvature.

In one embodiment, the coating 333 can be on a portion of the mesa sidewalls 221. In one embodiment, the coating can be closer to the working surface 112 than the recessed surface 319 of the body 313. In one embodiment, the recessed surface 319 of the body 313 can include a coating 333. The coating 333 can include chromium. The coating may be made of a material and have a sufficient thickness to prevent actinic radiation incident on the template side of the coating from curing the liquid extrusion 244a. In one embodiment, the recessed surface 319 of the body 313, the mesa sidewalls 221 can include a coating. In one embodiment, the coating can be on the mesa sidewalls 221 and extend towards the recessed surface 319 for a distance of between 0.1 μm and 10 μm.

Figure 4A:
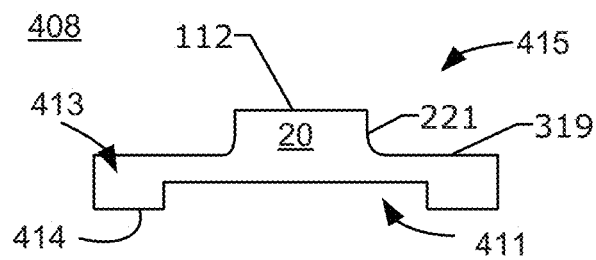
FIGS. 4A to 4I show a method of manufacturing a template, according to one embodiment.

The manufacturing process of a template, such as template 308 described above, may include steps which are shown schematically in FIGS. 4A-4G and FIG. 5, according to one embodiment. The method 500 can begin at a receiving step 510 by providing a template 408. The template 408 may be a blank template or there may be a pattern on the template 408. The template 408 can include a body 413 with an illumination side 414 and a patterning side 415. The illumination side 414 is the side of the template that is illuminated with actinic radiation during curing. The patterning side 415 is the side of the template that is used to pattern the formable material 124. In one embodiment, the template 408 can include a core-out 411 on the illumination side 414 of the body 413, as seen in FIG. 4A. The template 408 can also include a mesa 20 that extends from the patterning side 415 of the template 408. In one embodiment, the mesa 20 is separated from the body 413 of the template 408. In another embodiment, the mesa 20 is contiguous with the body 412 of the template 408.

Figure 4F:
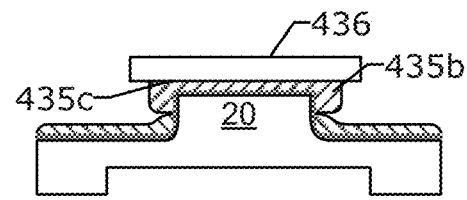
Figure 4B:
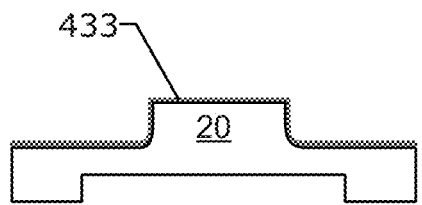

The method 500 can continue to a first deposition step 520 by depositing a coating such as a light-blocking layer 433 (gray layer in FIG. 4B) over all surfaces of the patterning side 415 of the template 408, as seen in FIG. 4B. In one embodiment, the light-blocking layer 433 may include one or more of chromium, molybdenum, tantalum, silicon, tungsten, titanium, aluminum, iron oxide, titanium, or a silver-halide emulsion. The light-blocking layer 433 may be deposited on the mesa 20, the working surface 112, the mesa sidewalls 221, a recessed surface 319, on the patterning side 415 of the template 408. The first deposition step 520 may be done using known methods such as sputtering and evaporation. The light blocking layer may have a thickness of 25-200 nm.

Figure 4G:
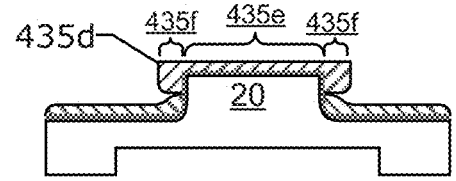
Figure 4C:
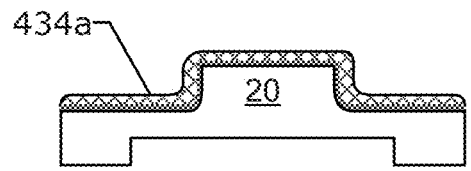

The method 500 may continue to a second depositing step 522 in which a liquid photoresist layer 434a may be deposited over the light-blocking layer 433 including the patterning side 415 of the template 408, and on top of the mesa 20 as illustrated in FIG. 4C in a second depositing step 52. Spin-coating may be used to deposit the liquid photoresist layer with an average thickness of 500 nm to 30 μm. The second depositing step 522 may include a subsequent photolithography step 524 that can be performed on the mesa 20 leaving the light-blocking layer 433 on the mesa unmasked and open to the environment, as seen in FIG. 4D. The subsequent photolithography step 524 may include an exposure step, a developing step, and an etching step such that the liquid photoresist layer 434a is removed from the chrome on top of the mesa 20 and solid photoresist layer 434b remains on the recessed surface 319. There may be some solid photoresist on the mesa sidewalls 221 depending on the accuracy of the subsequent photolithography step 524. In an embodiment, the liquid photoresist layer 434a may be a positive photoresist that becomes more soluble after being exposed to actinic radiation. In an embodiment, the liquid photoresist layer 434a may be a negative photoresist that becomes less soluble after being exposed to actinic radiation. The liquid photoresist layer 434a may be any material that can be used to form a pattern on the patterning side of the template 408.

The method 500 can continue at third deposition step 530 with the deposition of a photocurable material 435a on the top surface of the mesa 20. In one embodiment, the photocurable material 435a is deposited over the entire top surface of the mesa 20. In another embodiment, the photocurable material 435a is deposited over a portion of the top surface of the mesa 20. In one embodiment, the photocurable material 435a can be a plurality of photoresist droplets. In one embodiment, the photocurable material 435a is spin coated on top of the working surface 112. A planarizing surface 436 may be brought into contact with the photocurable material 435a as illustrate in FIG. 4F in a contacting step 532. The planarizing surface 436 causes the photocurable material 435a to form a photocurable liquid thin film 435c on the working surface 112. If the working surface 112 has features, then photocurable liquid film 435c fills in the features. The planarizing surface 436 may positioned relative to the working surface 112 so that the photocurable liquid thin film 435c has a minimum submicron thickness of 5, 10, 30, 50, 100, or 500 nm. In one embodiment, some of the photoresist droplets of the photocurable material 435a can be very close to the edge so that when the drops are contacted by planarizing surface and planarized, the droplets 435 runs over the edges of the mesa 20 and forms liquid extrusions 435b on the mesa sidewalls 221, as seen in FIG. 4F. In one embodiment, the photoresist droplets of the photocurable material 435a are placed within 100 µm of the edge of the mesa. In one embodiment, the photoresist droplets of the photocurable material 435a are placed between a placement threshold and 100 µm of the edge of the mesa. The placement threshold is determined by the placement accuracy (for example 30 µm) of the fluid dispenser 122. In one embodiment, the liquid extrusions 435b may be in contact with the solid photoresist layer 434b on the mesa sidewalls 221 or on the recessed surface 319. The planarizing surface 436 may be a second template with a second mesa that is larger than the mesa 20 of the template 408. The planarizing surface 436 may be a flat plate of for example glass.

The method 500 can continue at a curing step 540 by curing the photocurable material 435 including the liquid extrusions 435b and photocurable liquid thin film 435c while it is under the planarizing surface 436 to form a second cured film 435d as illustrated in FIG. 4G. In one embodiment, one or more light sources of actinic radiation are positioned over the planarizing surface 436 after the photocurable material 435 has been dispensed onto the mesa 20. In one embodiment, the second cured film 435d forms a layer on a portion of the top of the mesa 20 and a ring around the sides and edges of the mesa 20 adjacent the top of the mesa 20. In one embodiment, the second cured film 435d forms a layer on all of the top of the mesa 20 and a ring around the mesa sidewalls 221 adjacent the top of the mesa 20. In one embodiment, the second resist layer 435 extends from the top of the mesa 20 to cover the edges and the sides of the mesa 20. In one embodiment, the second cured film 435d act like a cap and covers the working surface 112, edge, and mesa sidewalls 221 abutting the top of the mesa 20. The planarizing surface 436 can then be separated from the second cured film 435d, as seen in FIG. 4G. The second cured film 435d can cover the top of the mesa 20 and side of the mesa 20. In one embodiment, the second cured film 435d can cover the working surface 112, the mesa sidewalls 221, and the curvature at the base of the mesa 20. The second cured film 435d includes a cured thin film 435e on the working surface 112 and thick cured extrusion 435f on the mesa sidewalls 112. The thinnest part of at least a top part (2-3 µm) of the thick cured extrusion 435f is thicker than thickest part of the thin cured thin film 435e. The thick cured extrusion 435f protects the light-blocking layer 433 during subsequent etching step and prevents actinic radiation from reach typical extrusions during imprinting. Typical extrusions tend be less than 3 µm high. The applicant has determined that the thick cured extrusion 435f only needs to protect the light-blocking layer 433 where typical extrusions might occur.

Figure 4H:
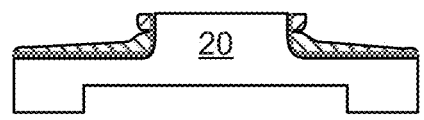
Figure 4D:
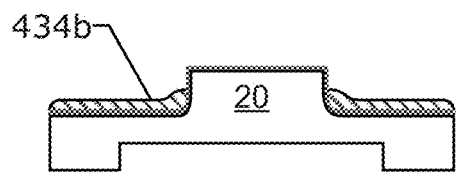
Figure 4I:
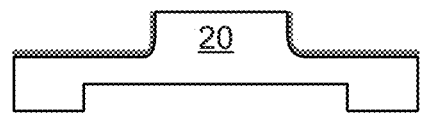
Figure 4E:
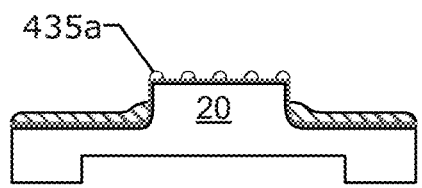

A subsequent etching step can remove both the cured thin film 435e and the light-blocking layer 433 from the working surface 112, as seen in FIG. 4H while leaving the thick cured extrusion 435f on all or a portion of the mesa sidewalls 221. The thick cured extrusion 435f may be on 5% to 20% portion of the mesa sidewalls 221. The subsequent etching step may include two etching steps, a first etching step which removes the cured thin film 435e from the working surface 112 exposing the light blocking layer 433 on the working surface 112 while leaving enough of the thick cured extension 435f to protect the light blocking layer 433 on the mesa sidewalls. The first etching step may have high etch selectively between light-blocking layer 433 and the cured thin film 435e. The first etching step may be stopped after the light-blocking layer 433 over the entire working surface 112 has been unmasked. A second etching step may be performed after the first etching step to remove the exposed light blocking layer 433. The second etching step may have a high etch selectivity between the light blocking layer 433 and the material of the template and the thick cured extrusion 435f. The second etching step may be performed until the working surface 112 is exposed, while thick cured extrusion 435f protects the light blocking layer 433 on mesa sidewalls 221 and the solid photoresist layer 434b protects the light blocking layer 433 on the recessed surface 319. The first etching step may be stopped after the entire working surface 112 has been unmasked. Another etching or washing step can be performed to remove the remaining solid photoresist layer 434b from the recessed surface 319 and the remaining thick cured extrusion 435f. Finally, the template 308 with the light-blocking layer 433 on the mesa sidewalls, as seen in FIG. 4I, can be used in manufacturing an article. In an embodiment, a pattern may be etched into the working surface 112 before or after chrome light-blocking layer 433 has been applied using nanoimprint lithography, photolithography, or e-beam lithography. The third deposition step 530, the contacting step 532, and the curing step 540 may be repeated several (for example, 2, 5, 8, 10, 20, 100, etc.) times in order to ensure that a sufficient portion of the mesa sidewalls are covered with the thick cured extrusion 435f. When these steps are performed repeatedly then the entire mesa sidewall can be protected.

In one embodiment a method of manufacturing an article can include dispensing a formable material 124 over a substrate 102. The substrate 102 can include a non-uniform surface topography or a blank template. The method of manufacturing an article can also include contacting the formable material 124 with a template 308, curing the formable material contacting the working surface 112 to form a layer over the substrate 102 while the formable material 124 remains in a liquid state. Curing is performed while the template 308 is contacting the formable material 124, separating the template 308 and the patterned layer on the substrate 102, processing the substrate 102 on which the patterned layer has been formed, and manufacturing the article from the processed substrate 102.

Figure 6:
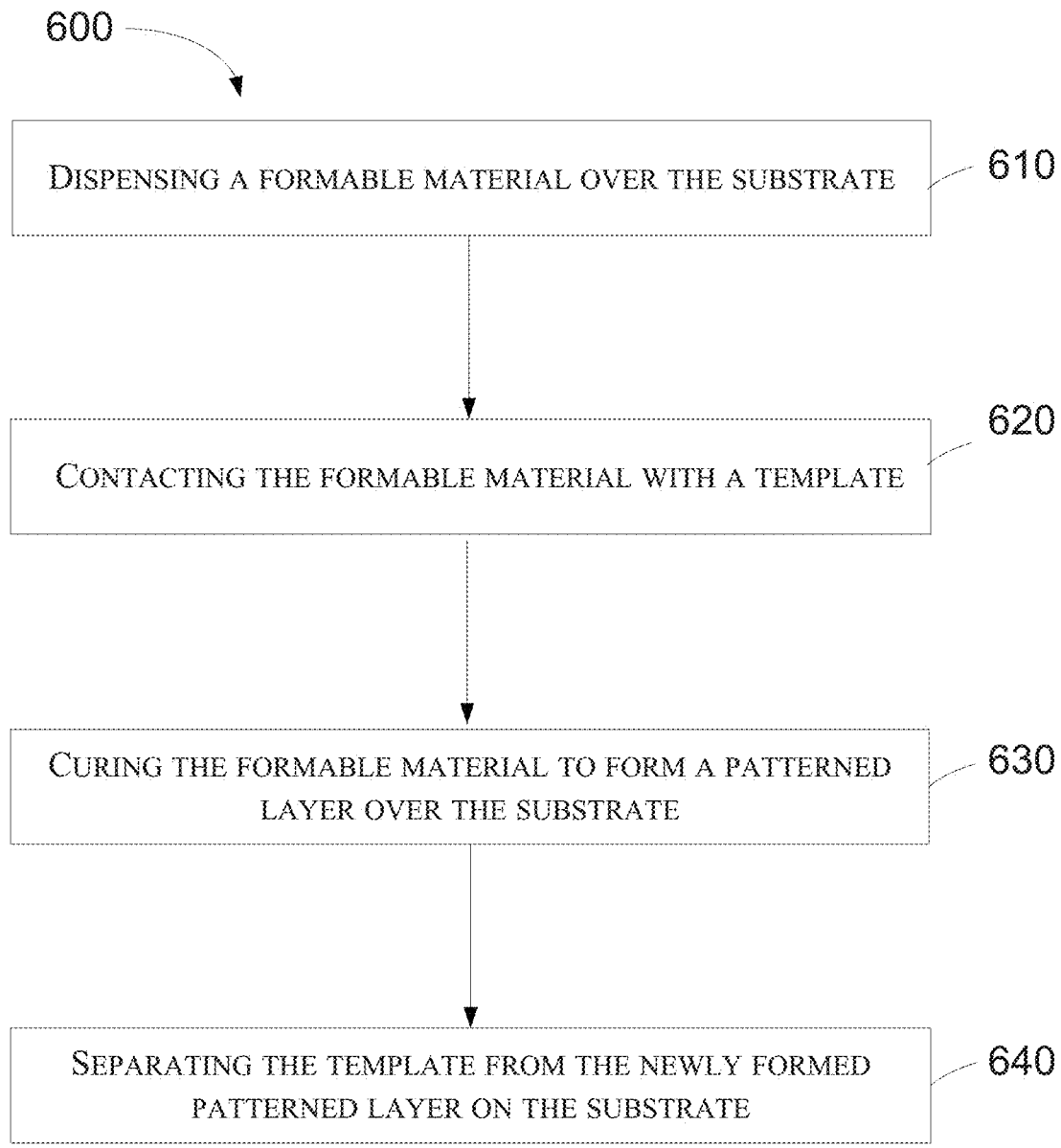
FIG. 6 includes an illustration of a method of the present disclosure, according to one embodiment.

FIG. 6 includes an illustration of a method 600 of the present disclosure, according to one embodiment. The method begins at dispensing operation 610 by dispensing formable material 124 onto the substrate 102. In one embodiment, the formable material 124 dispensed may be in the form of droplets. In one embodiment, the substrate 102 can include a non-uniform surface topography. In another embodiment, the surface of the substrate 102 may be uniform. In yet another embodiment, the surface of the substrate 102 may have a repeating or periodic pattern. The formable material 124 can include a polymerizable material, such as a resist. The formable material 124 can be positioned on the substrate 102 in one or more layers using techniques such as droplet dispense, spin-coating, dip coating, chemical vapor deposition (CVD), physical vapor deposition (PVD), thin film deposition, thick film deposition, or combinations thereof.

At contacting operation 620, a template 308, manufactured by the process described above, can contact the formable material 124. As the template 308 contacts the formable material 124, any trapped gas particles can dissipate through the curing layer, the substrate, or the template 308. In an embodiment, the template may be bowed during the contacting operation 620 to allow trapped gas to escape during the contacting operation 620. In one embodiment, the template 308 can include a body 313, a core-out 311, and a mesa 20. In one embodiment, the template 308 can contact the formable material 124 to form a film on the substrate 102.

At a curing operation 630, the formable material 124 can be cured to form a layer over the substrate 102. In one embodiment, curing is performed while the template 308 is contacting the formable material 124. In one embodiment, one or more light sources are positioned over the core-out 311 after the formable material 124 is dispensed on the substrate 102. The formable material 124 can include a monomer or oligomer mixture that can be cured using ultraviolet light, violet light, blue light, heat, or the like. In one embodiment, the mesa 20 can include a protective coating 333 on the mesa sidewalls 221. In another embodiment, the formable material 124 contacting the working surface 112 can be cured while the formable material 124 contacting the mesa sidewalls 221 can remain in a liquid state.

The method can continue at a separation operation 640, the template 308 can be separated from the newly formed cured pattern layer 246 formed on the substrate 102. As the template 308 separates, the formable material 124 that was on the template, including on the mesa sidewalls 221, evaporates away thereby preventing any extrusion defects that would have otherwise occurred.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of manufacturing a template, comprising:
   (a) providing the template, wherein the template comprises a body and a mesa, wherein the template comprises a first side and a second side, and wherein the mesa is on the second side of the body;
   (b) depositing a first coating on the second side of the template;
   (c) depositing a photocurable material over a top surface of the mesa;
   (d) contacting the photocurable material over the top surface of the mesa with a second surface to cause the photocurable material to cover the top surface of the mesa and to form a liquid extrusion on at least a portion of a side surface of the mesa;
   (e) curing the photocurable material to form a cured film on the top surface of the mesa and to form a cured extrusion on at least the portion of the side surface of the mesa, wherein the cured extrusion is thicker than the cured film;
   (f) etching the top surface of the mesa to remove the first coating and the cured film from the top surface of the mesa; and
   (g) removing the cured extrusion from the at least the portion of the side surface of the mesa to form the template with the first coating on the side surface of the mesa.

2. The method of manufacturing the template of claim 1, further comprising:
   depositing a second photoresist layer over the first coating prior to the deposition of the photocurable material over the top surface of the template; and
   removing the second photoresist layer from at least the top surface of the mesa.

3. The method of manufacturing the template of claim 2, further comprising removing the second photoresist layer from the template after removing the first coating from the top surface of the mesa.

4. The method of manufacturing the template of claim 1, wherein the photocurable material comprises a plurality of droplets and wherein at least one photocurable material droplet is deposited adjacent each edge of the mesa.

5. The method of manufacturing the template of claim 1, wherein the first coating comprises one or more of: chromium; molybdenum; tantalum; silicon; tungsten; titanium; aluminum; iron oxide; and a silver-halide emulsion.

6. The method of manufacturing the template of claim 1, wherein curing the photocurable material to form the cured film on the top surface and the side surface of the mesa is done while the second surface is in contact with the photocurable material.

7. The method of manufacturing the template of claim 1, further comprising separating the second surface from the cured film on the top surface and side surface of the mesa.

8. The method of manufacturing the template of claim 1, wherein the mesa has a curvature on a base portion of the mesa.

9. The method of manufacturing the template of claim 8, wherein the base portion of the mesa is between the top surface of the mesa and the second surface of the template.

10. The method of manufacturing the template of claim 1, wherein depositing the first coating on the second side of the template includes depositing the first coating on the top surface and sides of the mesa.

11. The method of manufacturing the template of claim 1, wherein the second surface of the body is substantially parallel to the first surface of the body.

12. The method of manufacturing the template of claim 1, wherein the template comprises a material selected from the group consisting of fused silica, quartz, sodium carbonate, calcium oxide, or any combination thereof.

13. The method of manufacturing the template of claim 1, wherein the extrusion is on all of the side surface of the mesa.

14. The method of manufacturing the template of claim 1, wherein the first coating is a light blocking layer.

15. The method of manufacturing the template of claim 1, wherein the photocurable material comprises a plurality of droplets and wherein at least one photocurable material droplet is deposited at a distance that is less than 100 μm of the side surface of the mesa.

16. The method of manufacturing the template of claim 1, wherein the first coating includes one or more of: a metal; a hydrophobic coating; a gas absorption coating; a conductive coating; and a hardening coating.

17. The method of manufacturing the template of claim 1, wherein steps (c) through (e) are repeated multiple times prior to step (f) being performed.

18. The method of manufacturing the template of claim 1, wherein the cured extrusion is on between 5% and 20% of the side surface of the mesa.

19. The method of manufacturing the template of claim 1, wherein spin-coating is used to deposit the photocurable material over the top surface of the mesa.

20. A method of manufacturing an article, comprising:
providing the template manufactured by the method of claim 1;
dispensing a formable material over a substrate;
contacting the formable material over the substrate with the top surface of the mesa; and
curing the formable material contacting the top surface of the mesa to form a patterned layer over the substrate;
separating the template from the patterned layer on the substrate;
processing the substrate on which the patterned layer has been formed; and
manufacturing the article from the processed substrate.

* * * * *